United States Patent
Jayapal et al.

(10) Patent No.: US 9,276,575 B2
(45) Date of Patent: Mar. 1, 2016

(54) LOW LEAKAGE STATE RETENTION SYNCHRONIZER

(71) Applicants: Senthilkumar Jayapal, Penang (MY); Mark E. Schuelein, Chandler, AZ (US); Deepak Bhatia, Santa Clara, CA (US)

(72) Inventors: Senthilkumar Jayapal, Penang (MY); Mark E. Schuelein, Chandler, AZ (US); Deepak Bhatia, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 14/083,185

(22) Filed: Nov. 18, 2013

(65) Prior Publication Data

US 2015/0138905 A1     May 21, 2015

(51) Int. Cl.
| | |
|---|---|
| G11C 11/412 | (2006.01) |
| G11C 8/04 | (2006.01) |
| H03K 19/003 | (2006.01) |
| G11C 5/14 | (2006.01) |
| G11C 19/00 | (2006.01) |

(52) U.S. Cl.
CPC .............. *H03K 19/003* (2013.01); *G11C 5/148* (2013.01); *G11C 19/00* (2013.01)

(58) Field of Classification Search
USPC .......... 365/154, 189.05, 233.1, 227; 327/199; 326/94
See application file for complete search history.

(56) References Cited

U.S. PATENT DOCUMENTS

| | | | | |
|---|---|---|---|---|
| 5,319,254 | A * | 6/1994 | Goetting | 327/198 |
| 2005/0005250 | A1 * | 1/2005 | Jones | 716/1 |
| 2011/0267125 | A1 * | 11/2011 | Jain | 327/203 |

* cited by examiner

*Primary Examiner* — Alexander Sofocleous
*Assistant Examiner* — Alfredo Bermudez Lozada
(74) *Attorney, Agent, or Firm* — Blakely, Sokoloff, Taylor & Zafman LLP

(57) ABSTRACT

Described is an apparatus which comprises: a first memory unit having an input and an output, wherein the first memory unit operates on a first power supply which is operable to be turned off; a second memory unit having an input coupled to the output of the first memory unit, and an output, wherein the second memory unit operates on a second power supply which is always on; and a control logic coupled to the first and second memory units, the control logic to provide one or more control signals to each of the first and second memory units.

13 Claims, 8 Drawing Sheets

LOW LEAKAGE STATE RETENTION SYNCHRONIZER

BACKGROUND

Synchronizers are logic units which are used to synchronize data between two different clock domains so that data can be transferred from one clock domain to another. Synchronizers are used to resolve meta-stability as quickly as possible. Synchronizers tend to use large devices and extra clock buffering to achieve lower "Tau." "Tau" is a measure of how quickly meta-stability is resolved i.e., how quickly a sequential unit can decide what the data is when a race condition exists between clock and data. Large sized device usage in a Synchronizer lowers "Tau" at the expense of capacitance on storage nodes of the Synchronizer. These storage nodes are generally critical nodes that hold the state of the sequential unit or latch. Extra capacitance on the storage nodes degrades speed and performance of the Synchronizer.

Even a small change in "Tau" can have a big impact on MTBF (Mean Time Before Failure). Furthermore, reset logic in the Synchronizer memory units (e.g., inside latches, flip-flops) adds devices and hence capacitance to storage nodes. This extra capacitance increases "Tau" and leakage power. On the other hand, state retention and low power objectives demands smaller devices and device stacking to reduce leakage power. It is challenging to incorporate state retention capability into the conventional Synchronizer because smaller devices increase "Tau" (and hence MTBF) while they reduce leakage.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

The embodiments describe a double state retention synchronizer that is capable to perform the functions of both synchronization and state retention such that low "Tau" and low leakage power consumption is achieved. In one embodiment, "Tau" is lowered by moving the sleep, reset, preset, etc., and other control logic devices out of the memory unit (e.g., latch, flip-flop) feedback path. In such an embodiment, capacitance on storage nodes of the memory unit, used to build the double synchronizer, is reduced. A lower load on storage nodes improves speed and performance (e.g., lower setup time) of the memory unit, and hence the synchronizer. Low leakage power is achieved for the double synchronizer by reducing number of devices in the always-on domain with minimum sized device width that retains state information.

Figure 1:
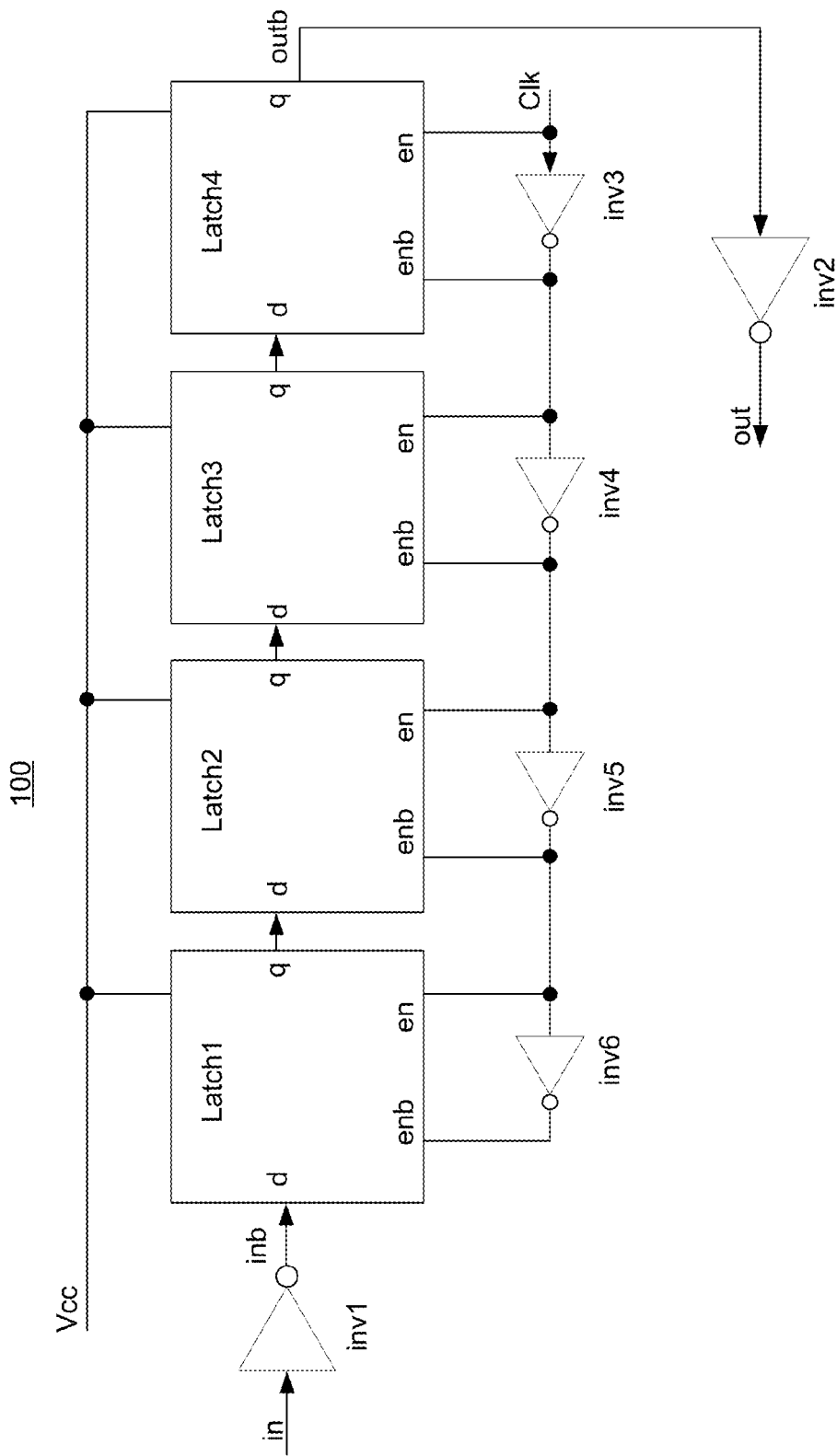
FIG. 1 illustrates a conventional Synchronizer operating on a single power supply.

A Synchronizer can be described as cross-coupled amplifiers with capacitive load, where "Tau" is directly related to amplifier gain and load it drives. Conventional synchronizer is designed with latches that lose their contents when power shuts off. FIG. 1 illustrates a Conventional Synchronizer 100 operating on a single power supply. Conventional Synchronizer 100 consists of four latches—Latch1, Latch2, Latch3, and Latch4—coupled together in series. Latch1 receives input "inb" which is an inverse of input "in." Latch4 generates inverse of output ("outb"). Inverter inv2 receives "outb" and generates "out" signal. Here, output of Latch1 is input to Latch2, output of Latch2 is input to Latch3, and output of Latch3 is input to Latch4.

For Conventional Synchronizer 100 to be able to reset or preset its output, extra transistors are added to the critical feedback loop of Conventional Synchronizer 100. These extra transistors add capacitance to storage nodes which slow down Conventional Synchronizer 100. The added capacitance may increase "Tau" by 20-50%, which increases the probability of failure (by meta-stability) in Conventional Synchronizer 100.

In this example, each latch includes logic to reset/preset the latch. The enable ("en") and its inverse ("enb") are inputs to each latch to control when to tri-state one of the cross-coupled inverters/amplifiers in the latch. Here, "en" and "enb" receive clock ("Clk") input via inverters inv3, inv4, inv5, and inv6. All circuits (i.e., latches and inverters) of Conventional Synchronizer 100 operate on Vcc power supply. When Vcc is ramped down (e.g., during sleep mode, or other low power mode), Latches1-4 lose their content.

In one embodiment, the extra transistors added to the latches for enabling reset/preset functions are moved outside of the latches to lower capacitive load on critical storage nodes of the latches. In one embodiment, clock signal(s) are used to make the latch operate in transparent or in latch modes. In one embodiment, to reset the synchronizer, reset signal triggered by the combinational logic gate from the input of the first latch is propagated through rest of the latches which are made to operate in transparent mode. In such an embodiment, all four latches operate in transparent mode.

To retain state information when Vcc is being ramped down, in one embodiment, state retention latch (SRLAT) is introduced in which retention capability is enabled by having the entire logic to operate on the always-on power supply domain. In one embodiment, to reduce leakage power, power optimized SRLAT is introduced with entire logic in always-on power domain except for an output inverter (i.e., coupled to the storage node(s) of the cross-coupled amplifier) which is moved to a power gated domain.

In one embodiment, by separating circuits associated with state control functions such as reset and sleep from a latch, the latch in the embodiments is better optimized for synchronization even when the state control functions are added to the overall latch function. When designing a Synchronizer, there is a trade-off between the effectiveness (e.g., measured by "Tau") of the Synchronizer and its power consumption.

Reducing "Tau" usually means increasing power and increasing device sizes. The embodiments allows for more optimization for power while maintaining good "Tau."

While some of the embodiments show that the second and fourth latches in a series of latches of a Synchronizer have state retention, state retention is not limited to the second and fourth latches. In some embodiments, other latches may have state retention. For example, in one embodiment, state retention resides in the first latch only. In one embodiment, only state retention resides only in the first and third latches. In one embodiment, state retention only resides in the second latch. In other embodiments, other combination of latches may be used for state retention.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes in and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
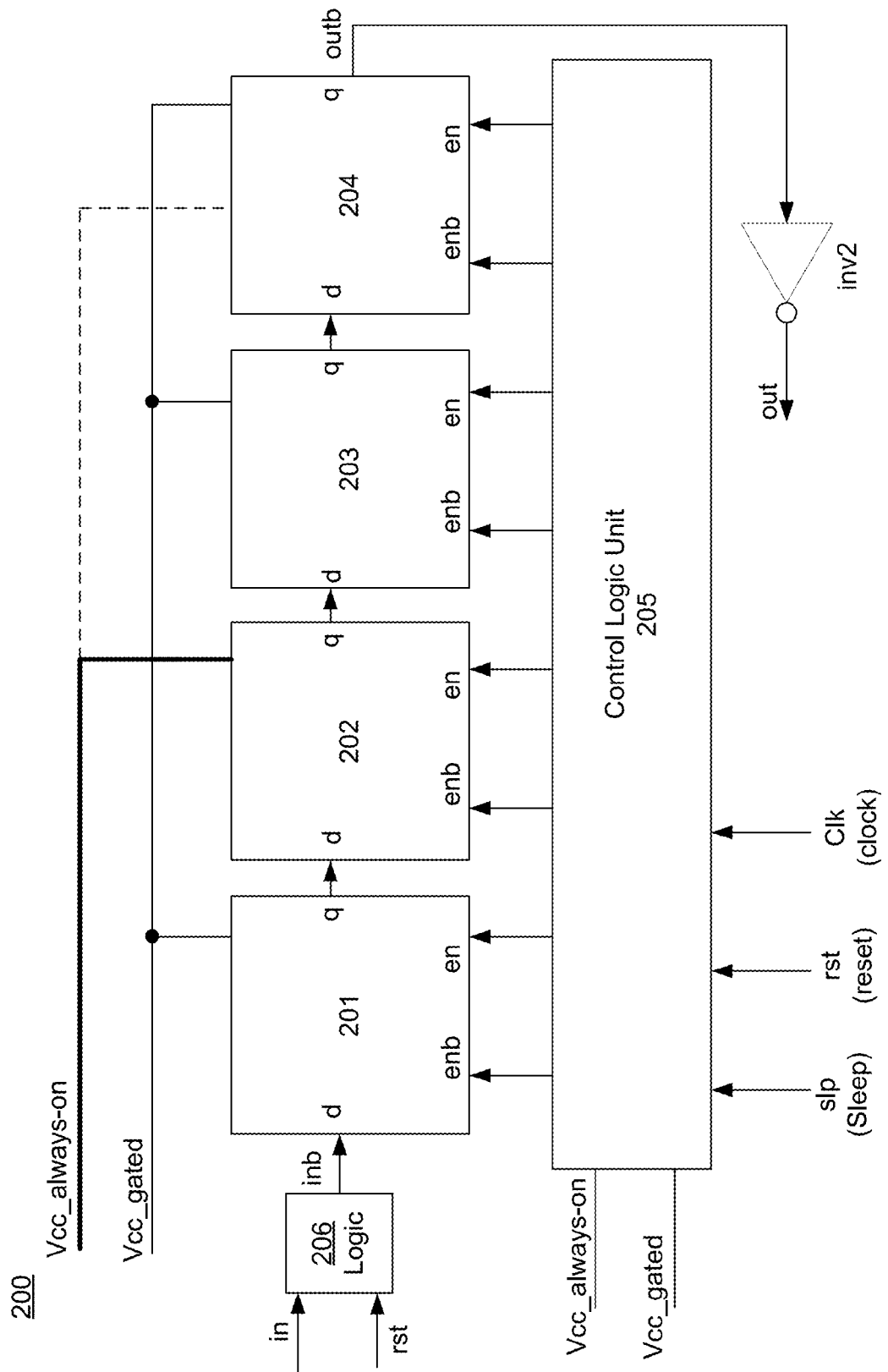
FIG. 2 illustrates a low power Synchronizer with retention, according to one embodiment of the disclosure.

FIG. 2 illustrates a low power synchronizer 200 (Synchronizer) with retention, according to one embodiment of the disclosure. It is pointed out that those elements of FIG. 2 having the same reference numbers (or names) as the elements of any other figure can operate or function in any manner similar to that described, but are not limited to such.

In one embodiment, Synchronizer 200 (also referred as double synchronizer) comprises sequential units (e.g., latches, flip-flops, memory cells (e.g., SRAM cells)) 201, 202, 203, and 204 coupled together in series; Control Logic Unit 205, Logic 206; and inverter inv2. While the embodiments are discussed with reference to four latches, more than four latches may be used such that the fifth latch (not shown) is coupled in series to Latch 204 and operates on Vcc_gated domain.

In one embodiment, Logic 206 receives reset (rst) and input ("in") signals and generates new input "inb." Here, names for signals and nodes are interchangeably used. For example, "in" is used to refer to signal "in" or node "in" depending on the context of the sentence. If reset is enabled, then "inb" is gated by the "rst" signal and has a deterministic value that causes Latch 201 to reset, else it "in" is inverted to form "inb" which is then input to data input 'd' of Latch 201. In this embodiment, reset/preset logic discussed with reference to Conventional Synchronizer 100 is moved out of the latches and placed in the Control Logic Unit 205.

In one embodiment, Logic 206 includes a NAND gate and an inverter, where the inverter inverts "rst" signal and inputs the inverted reset signal to NAND gate, and where NAND gate also receives the "in" signal. In other embodiments, other logic gates may be used to implement Logic 206. In one embodiment, Latch 201 includes Logic 206. In such an embodiment, Latches 202-204 do not include Logic 206. For example, first latch in the series of latches is operable to be reset while the other latches propagate that reset by controlling inputs "en" and "enb" to those other latches.

In one embodiment, when Latch 201 is reset, Latches 202-204 are made transparent by Control Logic Unit 205. In this embodiment, reset is propagated from Latch 201 to Latches 202-204 because Latches 202-204 are transparent. In this embodiment, data is retained and made available as output as soon as Vcc_gated power supply is ramped up. In normal mode (i.e., active mode when Vcc_gated is powered up at normal level), Synchronizer 200 behaves like Conventional Synchronizer 100, however, in sleep mode (or low power mode when Vcc_gated is powered down) data is retained in slave portions with SRLATs (i.e., Latch 201 and/or Latch 204). In this embodiment, Latches 202-204 (and other latches coupled in series to Latch 204) do not have reset logic embedded in them. While the embodiments are explained with reference to "reset," they are applicable for other trigger signals such as "preset," "clear," "set," etc.

In one embodiment, Latch 202 is an SRLAT which operates on Vcc_always-on power supply. In this embodiment, Latch 201 and Latch 203 operate on Vcc_gated power supply. In one embodiment, Latch 204 operates on Vcc_always-on power supply. In one embodiment, Latch 204 operates on Vcc_gated power supply. Here, "Vcc_always-on" power supply is a power supply that is available (i.e., powered up) when a processor or circuit having Synchronizer 200 is powered down. Here, "Vcc_gated" power supply is a power supply which can ramp down to a lower level or all the way to zero during low power mode(s) or off mode. For example, during sleep ("slp") mode, Vcc_gated power supply may be turned off or powered down. In one embodiment, when Vcc_gated power supply is ramped down, Latch 201, Latch 203, and/or Latch 204 (depending on whether it is powered by Vcc_gated or Vcc_always-on) are turned off and lose their previous data.

In one embodiment, Control Logic Unit 205 is used to enable latches which assist in setting them either in latch or transparent mode by using the reset/preset/sleep enable control signals which are input to Control Logic Unit 205. In one embodiment, normal latches with reset/preset circuits are removed from Synchronizer 200, and Latch 201 and Latch 204 are used to form the master side. In one embodiment, state retentive latches (i.e., SRLAT) are used for Latch 203 and Latch 204. In one embodiment, when a latch (i.e., one of Latches 201-204) is enabled (e.g., "en" is HIGH and "enb" is LOW) then that latch performs in transparent mode. In one embodiment, when a latch (i.e., one of Latches 201-204) is disabled (e.g., "en" is LOW and "enb" is HIGH) then that latch performs in latch mode (i.e., storage mode using its cross-coupled inverters or amplifiers).

In one embodiment, Control Logic Unit 205 receives "Clk" signal which is used to cause the latch to be in transparent or latch mode. In one embodiment, Control Logic Unit 205 operates all its logic except for one or more devices on Vcc_gated power domain. In one embodiment, inverters generating "en" or "enb" signals for Latch 202 (and/or Latch 204) are operated on Vcc_always-on power supply. For example, when Latch 204 operates on Vcc_always-on power supply, corresponding inverter that provides "en" or "enb" signals is also on Vcc_always-on power supply. In one embodiment, when Latch 204 operates on Vcc_gated power supply, corresponding inverter that provides "en" or "enb" signals is also on Vcc_gated power supply.

In this embodiment, by pulling reset/preset logic from the latches to the Control Logic Unit 205, capacitance is reduced from storage nodes on the latches which reduces "Tau." In one embodiment, relatively good values (i.e., lower values) of "Tau" can be achieved with minim sized devices. Being able to use minimal sized devices while still achieving good values of "Tau" reduces leakage for low power circuits. As "Tau" reduces, MTBF increases which reduces the likely hood that Synchronizer 200 will be meta-stable.

While some of the embodiments show that the second 201 and fourth 204 latches in a series of latches of Synchronizer 200 have state retention, state retention is not limited to the second 201 and fourth 204 latches. In one embodiment, state retention is provided by Vcc_always-on power supply to a latch. In some embodiments, other latches may have state retention. For example, in one embodiment, state retention resides in the first latch 201 only. In one embodiment, state retention resides only in first latch 201 and third latch 203. In one embodiment, state retention resides only in second latch 202. In other embodiments, other combination of latches may be used for state retention.

Figure 3:
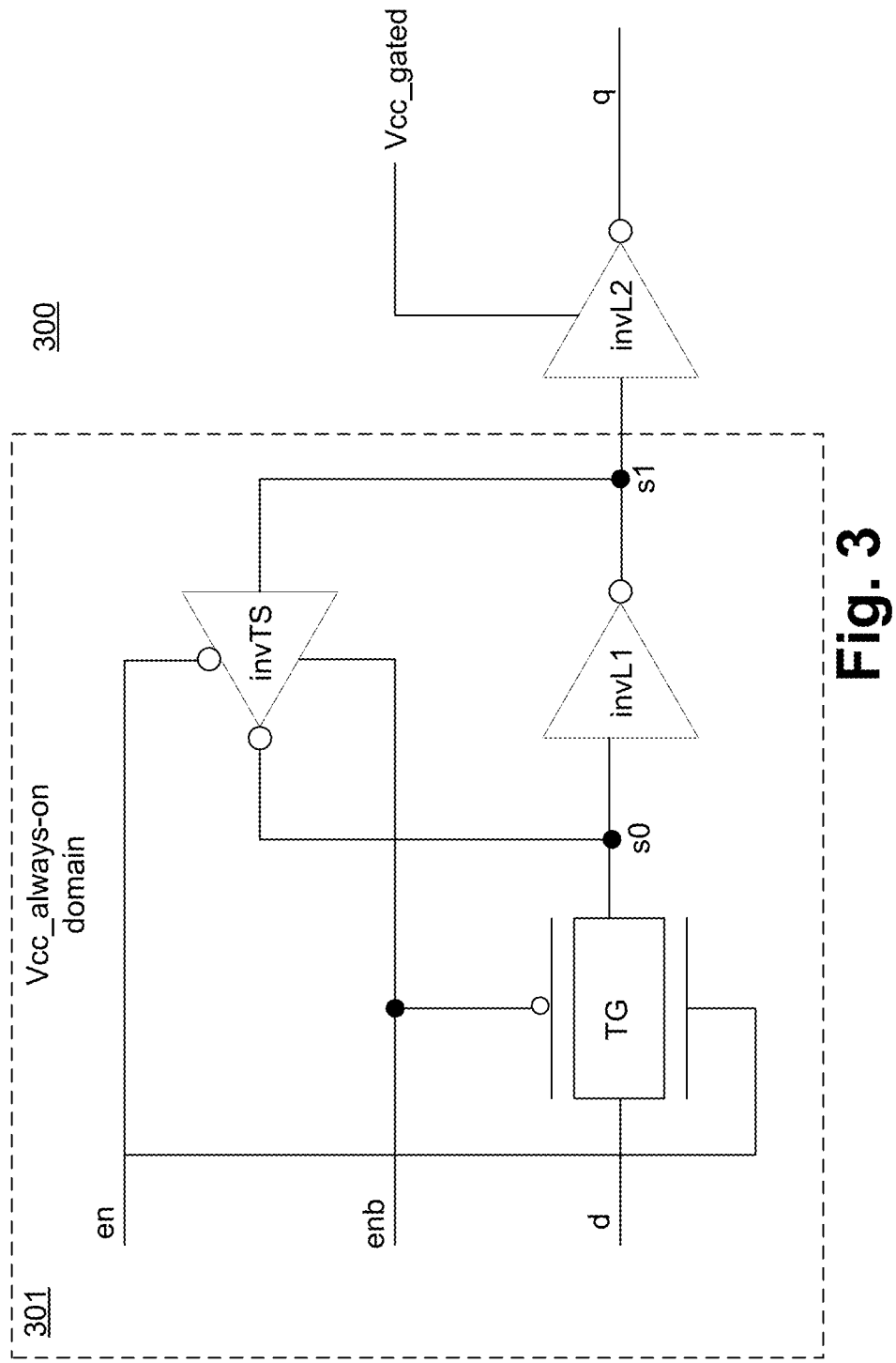
FIG. 3 illustrates a multi-power domain latch for the low power Synchronizer with retention, according to one embodiment of the disclosure.

FIG. 3 illustrates a multi-power domain latch 300 for the low power synchronizer with retention, according to one embodiment of the disclosure. It is pointed out that those elements of FIG. 3 having the same reference numbers (or names) as the elements of any other figure can operate or function in any manner similar to that described, but are not limited to such.

In one embodiment, latch 300 (e.g., Latch 201-204) comprises a transmission gate (TG), inverter invL1, inverter invL2, and tri-stable inverter invTS. In this embodiment, input data is received by TG and provided to storage node "s0." The other storage node is "s1." Inverter invL1 and tri-stable inverter invTS are cross-coupled inverting devices (or amplifiers) that cause data to be stored on storage nodes "s0" and "s1." When latch 300 is in transparent mode, TG is enabled (i.e., "enb" is LOW and "en" is HIGH) and invTS is tri-stated. When latch 300 is in latch mode, TG is disabled (i.e., "enb" is HIGH and "en" is LOW) and invTS is enabled. Output "s1" is coupled to input of invL2 which generates the latch output 'q.'

In one embodiment, latch 300 is operated using two power supplies. In this embodiment, TG, invL1, and invTS are grouped together in block 301 to operate on Vcc_always-on power domain while invL2 operates on Vcc_gated power domain. In one embodiment, block 301 is part of SRLAT (e.g., Latch 202 and/or Latch 204) such that block 301 operates on an always-on power supply while invL2 of SRLAT is on a gated power supply (i.e., Vcc_gated power supply). In one embodiment, block 301 and invL2 also operate on the Vcc_gated power supply. In such an embodiment, latch 300 is used for Latches 201, 203 and/or 204. In the embodiment of FIG. 3, reset, preset, set, or clear logic is not included in latch 300, but moved to Control Logic Unit 205 or other logic units (e.g., Logic 206). While the embodiments are explained with reference to a latch design like latch 300, any type of latch design may be used.

Figure 4:
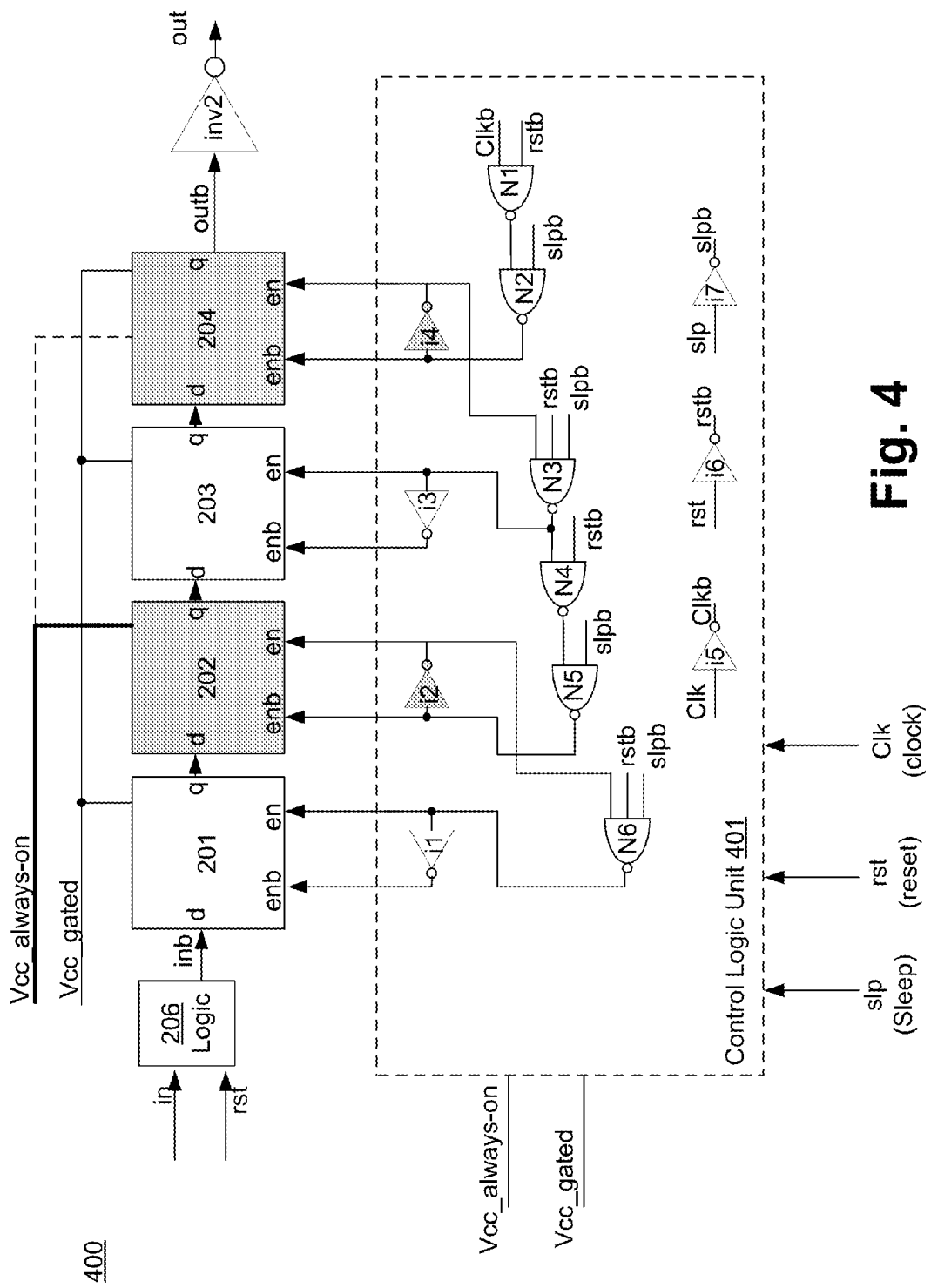
FIG. 4 illustrates a low power Synchronizer with retention and having reset and sleep capabilities, according to one embodiment of the disclosure.

FIG. 4 illustrates a low power synchronizer 400 with retention and having reset and sleep capability, according to one embodiment of the disclosure. It is pointed out that those elements of FIG. 4 having the same reference numbers (or names) as the elements of any other figure can operate or function in any manner similar to that described, but are not limited to such.

In this embodiment, Control Logic Unit 401 (e.g., 205) and its logic are described. In one embodiment, Control Logic Unit 401 includes NAND gates N1, N2, N3, N4, N5, and N6, where N1, N2, N4, and N5 are two input NAND gates while N3 and N6 are three input NAND gates. In one embodiment, Control Logic Unit 401 also comprises inverters i1, i2, i3, i4, i5, i6, and i7. In one embodiment, Control Logic Unit 401 receives "rst" (i.e., reset), "slp" (i.e., sleep), and "Clk" (i.e., Clock) signals. In one embodiment, Control Logic Unit 401 receives both Vcc_gated and Vcc_always-on power supplies. In one embodiment, inverter i2 is on Vcc_always-on power supply. In one embodiment, when Latch 204 operates on Vcc_always-on power supply then inverter i4 also operates on Vcc_always-on power supply. The remaining logic units in Control Logic Unit 401 operate on Vcc_gated power supply.

In one embodiment, NAND N1 receives inputs "Clkb" and "rstb" to generate output for NAND N2. In one embodiment, "rstb" is generated by inverter i6 which receives "rst" as input. In one embodiment, "Clkb" is generated by inverter i5 which receives "Clk" as input. In one embodiment, NAND N2 receives output of NAND N1 and "slpb" signal as inputs. In one embodiment, "slpb" is generated by inverter i7 which receives "slp" as input. In one embodiment, output of NAND N2 drives inverter i4 and "enb" port of Latch 204. In one embodiment, inverter i4 drives "en" port of Latch 204 and input of NAND N3.

In one embodiment, NAND N3 receives input from inverter i4 and inputs "rstb" and "slpb." In one embodiment, output of NAND N3 drives "en" port of Latch 203, input of NAND N4, and input of inverter i3. In one embodiment, inverter i3 drives "enb" port of Latch 203. In one embodiment, NAND N4 drives NAND N5. In one embodiment, NAND N5 also receives input "slpb" in addition to output of NAND N4. In one embodiment, output of NAND N5 is received by port "enb" of Latch 202 and input of inverter i2.

In one embodiment, inverter i2 drives "en" port of Latch 202 and input of NAND N6.

In one embodiment, inverter i1 receives output from NAND N6 as input and generates an output to drive "enb" port of Latch 201. In this embodiment, "en" port of Latch 201 is driven by NAND N6. In one embodiment, NAND N6 receives inputs "rstb," "slpb," and input from inverter i2, where "rstb" is an inverse of "rst," and where "slpb" is an inverse of "slp."

In one embodiment, each latch is identical and has the same "Tau." In one embodiment, Logic 206 includes a Multiplexer (not shown) to receive input in and scan input. In one embodiment, the Multiplexer is controlled by a select signal to select between regular input "in" or scan input. In one embodiment, output of Multiplexer is received by a logic gate(s) that also processes "rst" signal. While the embodiments show an inverting path i.e., input "in" is inverted to "inb" before being received by Latch 201 and output "outb" from Latch 204 being inverting by inverter inv2, the embodiments can be modified to be non-inverting without changing the essence of various embodiments.

In one embodiment, input "inb" is received by Latch 201 to the left while "Clkb" is received by NAND N2 to the right such that Latch 204 receives an early indication for "enb" and "en." In such an embodiment, clock signal flows from right to left while data propagates from left to right to prevent data shoot-through on the falling edge of "Clkb." In one embodiment, when "rst" is logical high, "out" is logical low. In such an embodiment, Latch 201 is reset by Logic Unit 206 while reset propagates through Latches 202, 203, and 204. In one embodiment, state is retained by closing the first slave latch i.e., Latch 201 and opening all other slaves i.e., Latches 202, 203, and 204.

Figure 5:
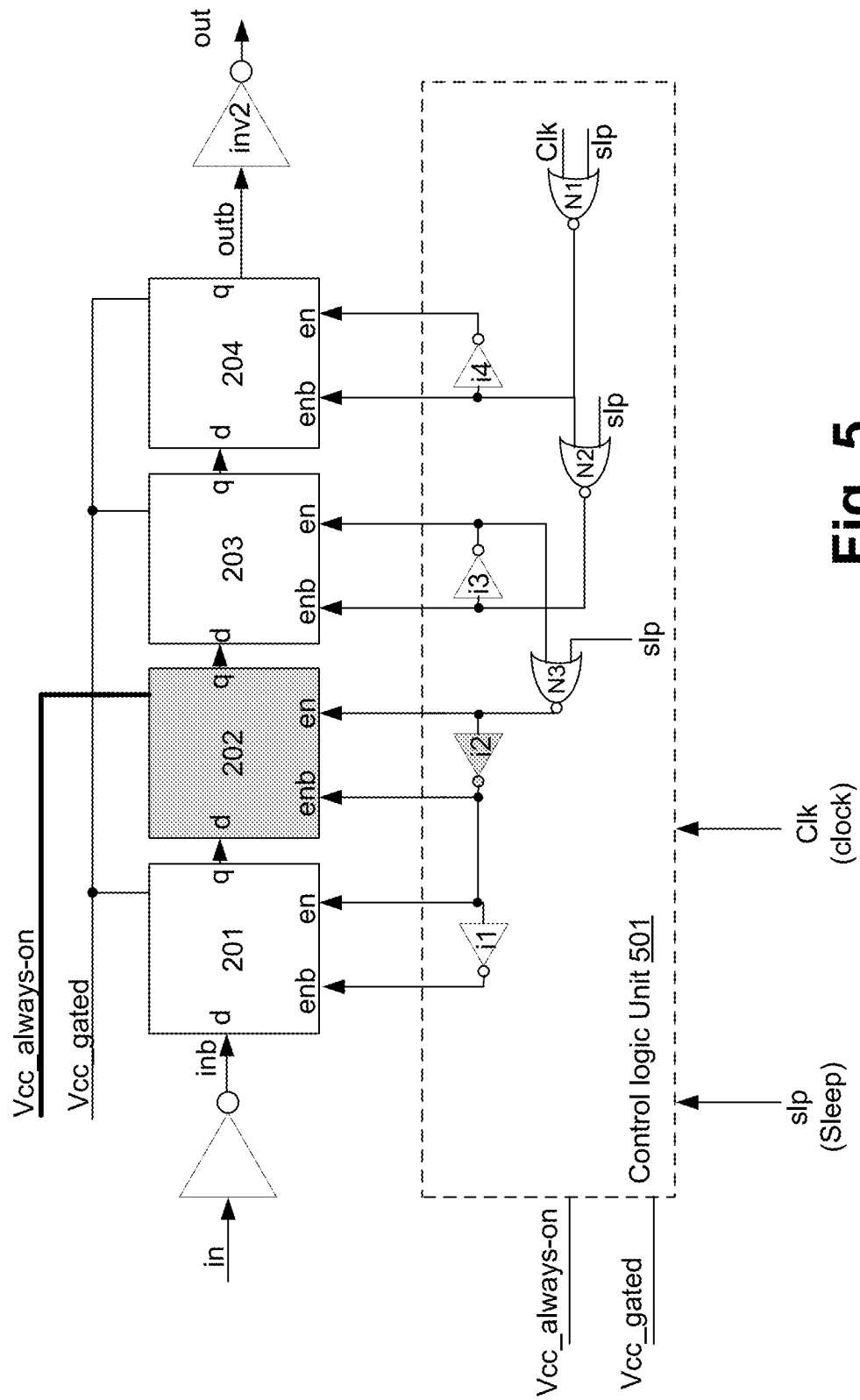
FIG. 5 illustrates a low power Synchronizer with retention and sleep capability, according to one embodiment of the disclosure.

FIG. 5 illustrates a low power synchronizer 500 with retention and sleep capability, according to one embodiment of the disclosure. It is pointed out that those elements of FIG. 5 having the same reference numbers (or names) as the elements of any other figure can operate or function in any manner similar to that described, but are not limited to such.

In one embodiment, Synchronizer 500 has the same four latches coupled together such that Latch 202 is on Vcc_always-on power supply while other latches (i.e., Latch 201, Latch 203, and Latch 204) are on Vcc_gated power supply. In this embodiment, Control Logic Unit 501 receives "slp" and "Clk" signals, and reset signal is not used. In this embodiment, Logic Unit 206 is replaced by an inverter that receives input in and provides "inb" to Latch 201. In this embodiment, inverter i2 operates on Vcc_always-on power supply.

In one embodiment, Control Logic Unit 501 comprises NOR gates N1, N2, and N3 and inverters i1, i2, i3, and i4. In one embodiment, NOR N1 receives "Clk" and "slp" signal and generates an output which drives NOR N2, inverter i4, and "enb" port of Latch 204. In one embodiment, inverter i4 drives "en" port of Latch 204. In one embodiment, NOR N2 receives output of NOR N1 and "slp" signal. In one embodiment, output of NOR N2 drives inverter i3 and port "enb." In one embodiment, inverter i3 drives "en" port of Latch 203 and NOR N3. In one embodiment, NOR N3 receives output of inverter i3 and "slp" signal. In one embodiment, NOR N3 drives "en" port of Latch 202 and input of inverter i2. In one embodiment, inverter i2 drives port "enb" of Latch 202 and port "en" of Latch 201. In one embodiment, inverter i1 receives input from inverter i2 and drives port "enb" of Latch 201.

Figure 6:
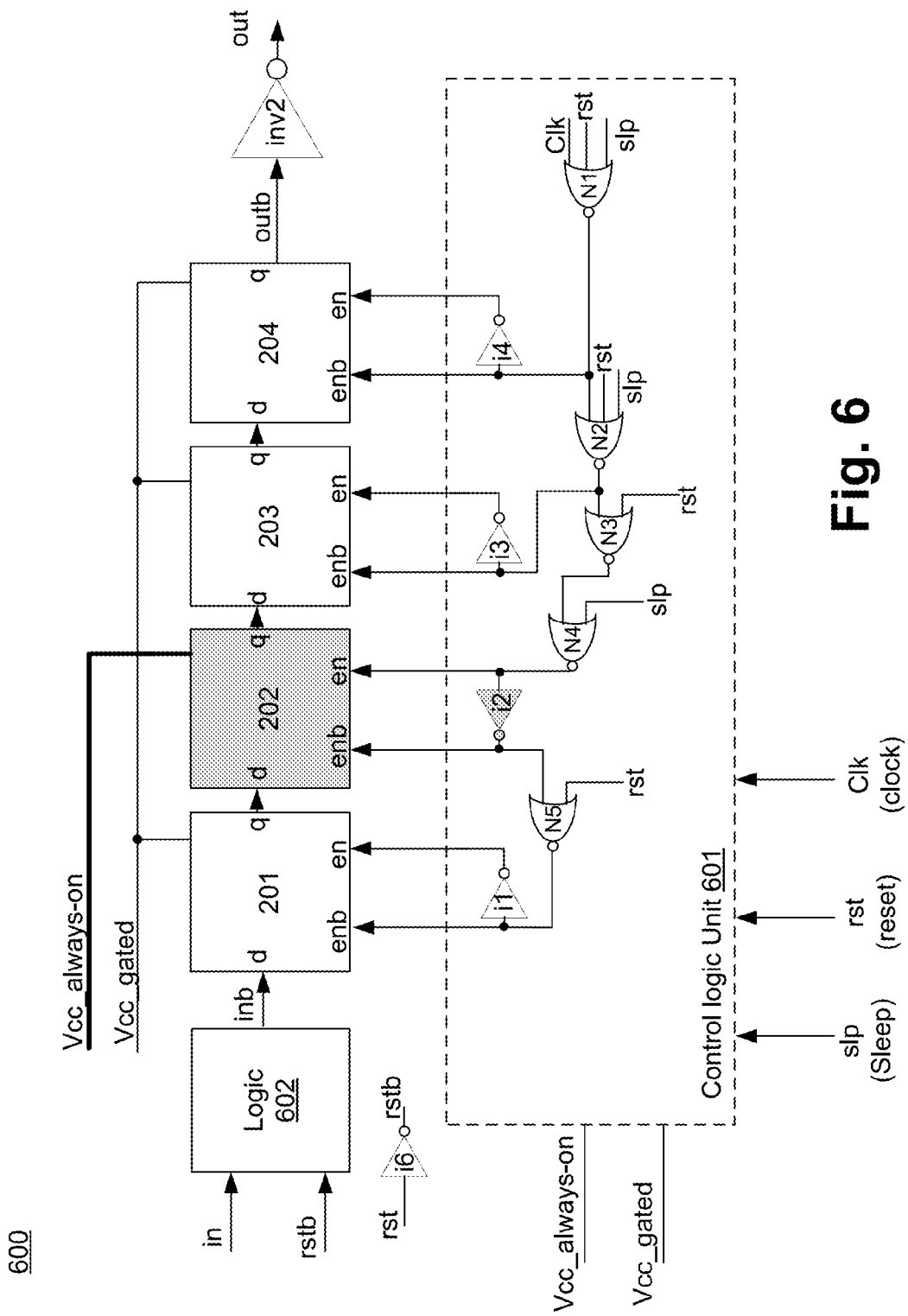
FIG. 6 illustrates a low power Synchronizer with retention and having reset and sleep capabilities, according to another embodiment of the disclosure.

FIG. 6 illustrates a low power synchronizer 600 with retention and having reset and sleep capability, according to another embodiment of the disclosure. It is pointed out that those elements of FIG. 6 having the same reference numbers (or names) as the elements of any other figure can operate or function in any manner similar to that described, but are not limited to such.

In one embodiment, Synchronizer 600 has the same 4 latches coupled together such that Latch 202 is on Vcc_always-on power supply while other latches (i.e., Latch 201, Latch 203, and Latch 204) are on Vcc_gated power supply. In this embodiment, Control Logic Unit 601 receives "Clk," "rst," and "slp" signals. In this embodiment, inverter i2 operates on Vcc_always-on power supply.

In one embodiment, Control Logic Unit 601 comprises NOR gates N1, N2, N3, N4, and N5; and inverters i1, i2, i3, and i4. In one embodiment, NOR N1 receives "Clk," "rst," and "slp" signals and generates an output which drives NOR N2, inverter i4, and "enb" port of Latch 204. In one embodiment, inverter i4 drives en port of Latch 204. In one embodiment, NOR N2 receives output of NOR N1, and "rst" and "slp" signals. In one embodiment, output of NOR N2 drives inverter i3 and port "enb." In one embodiment, inverter i3 drives "en" port of Latch 203. In one embodiment, NOR N3 receives output of NOR N2 and "rst" signal. In one embodiment, output of NOR N3 is received by NOR N4 which also receives "slp" signal. In one embodiment, NOR N4 drives "en" port of Latch 202 and input of inverter i2. In one embodiment, inverter i2 drives port "enb" of Latch 202. In one embodiment, inverter i2 also drives NOR N5 which also receives "rst" signal. In one embodiment, NOR N5 drives inverter i1 and "enb" port of Latch 201. In one embodiment, inverter i1 drives port "en" of Latch 201.

Figure 7:
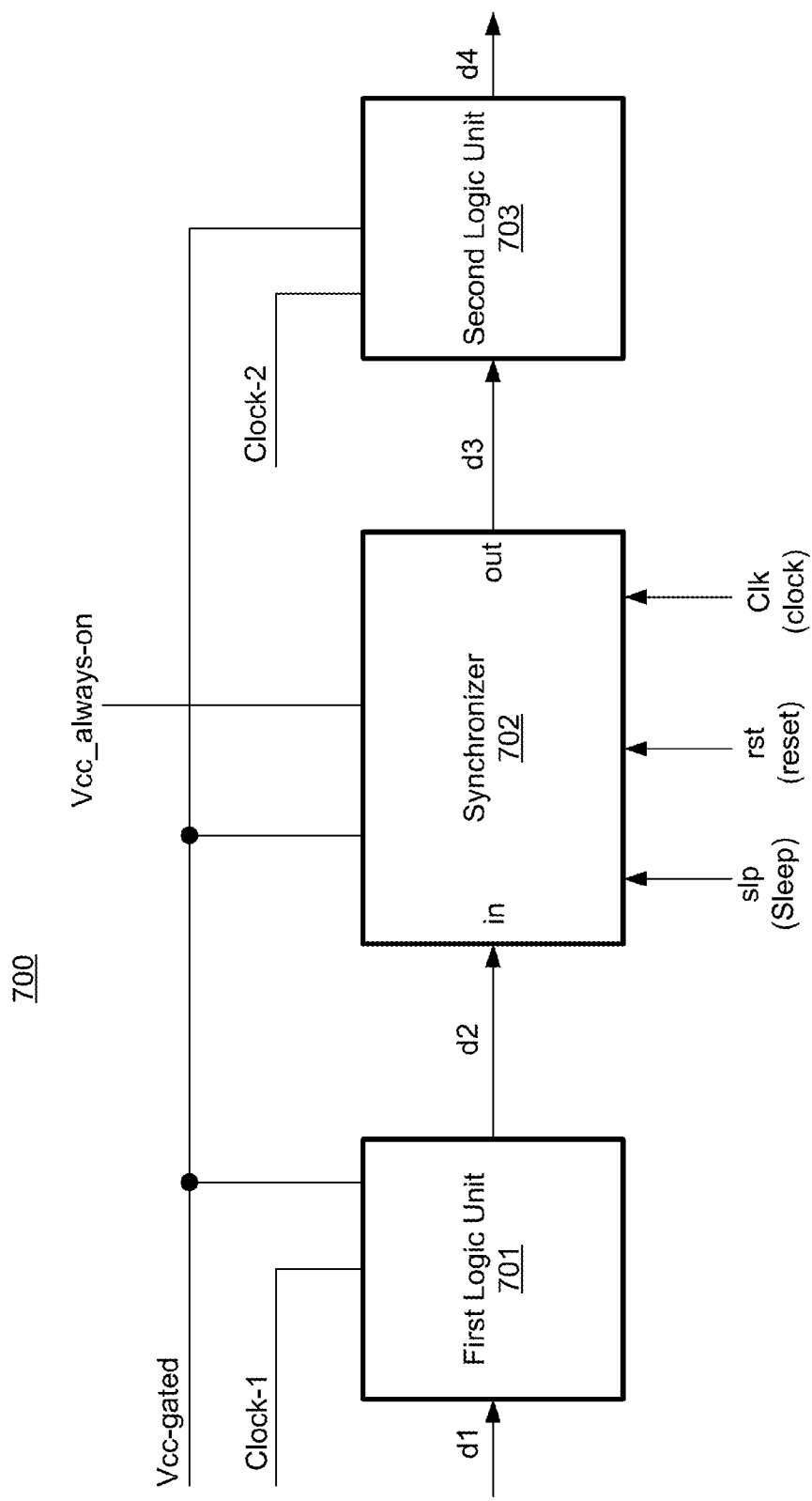
FIG. 7 illustrates a circuit showing usage model of the low power Synchronizer, according to one embodiment of the disclosure.

FIG. 7 illustrates a circuit 700 showing usage model of the low power synchronizer, according to one embodiment of the disclosure. It is pointed out that those elements of FIG. 7 having the same reference numbers (or names) as the elements of any other figure can operate or function in any manner similar to that described, but are not limited to such.

In one embodiment, circuit 700 comprises First Logic Unit 701, Synchronizer 702, and Second Logic Unit 703. In one embodiment, First Logic Unit 701 comprises logic units and sequential units which operate on Vcc-gated power supply domain. In this embodiment, First Logic Unit 701 operates on a first clock domain Clock-1. In one embodiment, First Logic Unit 701 receives one or more inputs "d1" and generates output "d2." Output "d2" may be synchronized to Clock-1 domain.

In one embodiment, Synchronizer 702 operates on both Vcc-gated and Vcc-always-on power supply domains. Synchronizer 702 is according to any embodiments of Synchronizers discussed here. In one embodiment, output "d2" of Synchronizer 702 is received by Second Logic Unit 703 as "d3" which operates on a second clock domain Clock-2. In one embodiment, Second Logic Unit 703 generates output "d4." In one embodiment, first and second clock domains are different or unrelated. In one embodiment, Second Logic Unit 703 operates on Vcc-gated power supply domain.

While the embodiments show examples in which second latch and fourth latch, or just second latch have state retention using always-on power supply, state retention can be prescribed to any of the latches. For example, depending on design, state retention can reside in the first latch only, according to one embodiment. In one embodiment, state retention can reside in first and third latches. In one embodiment, state retention can reside in third latch only. Other combinations of selecting state retention latches in a series of latches in a Synchronizer are also possible using the embodiments.

Figure 8:
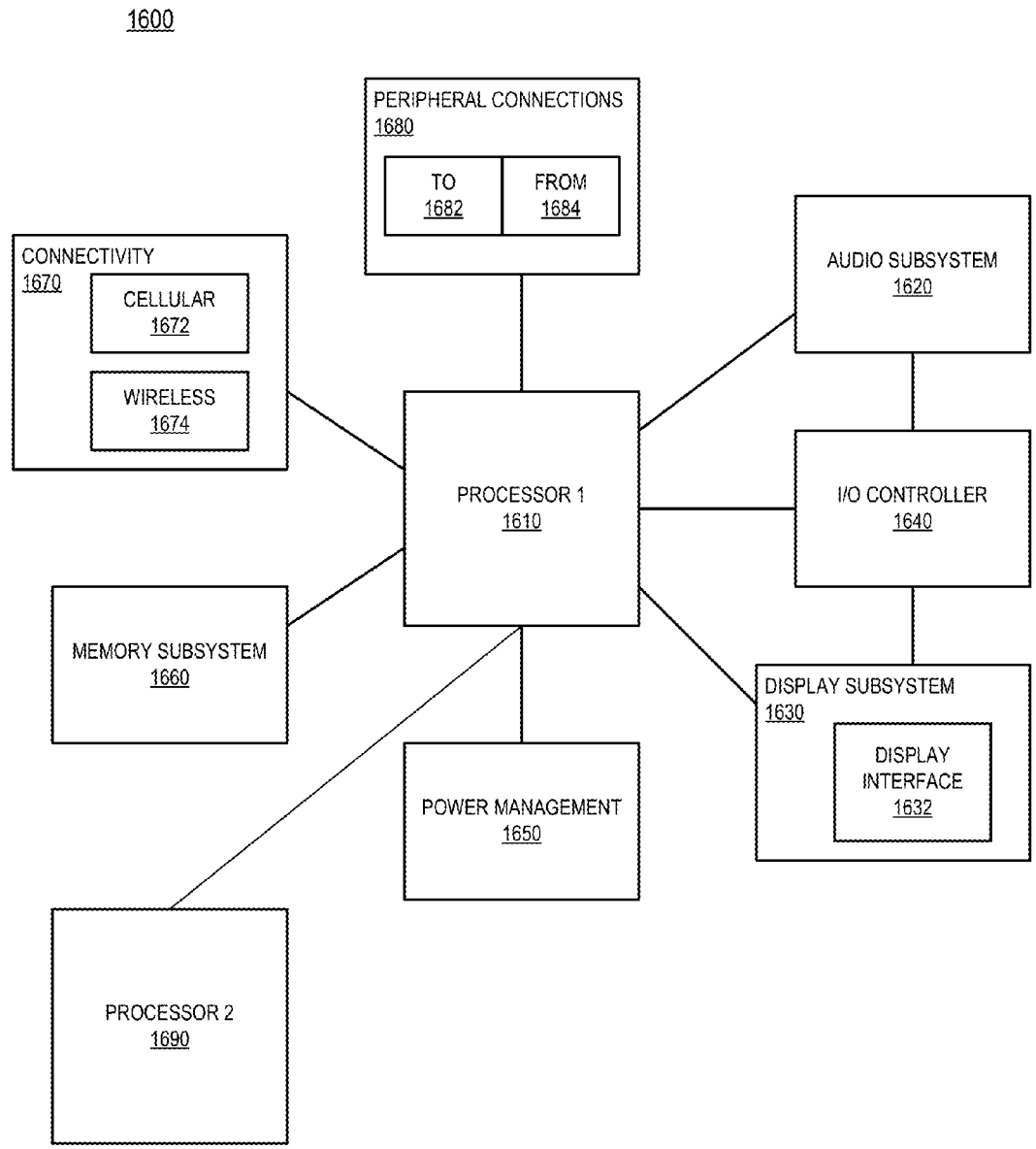
FIG. 8 is a smart device or a computer system or an SoC (System-on-Chip) with low power Synchronizer with retention, according to one embodiment of the disclosure.

FIG. 8 is a smart device or a computer system or an SoC (System-on-Chip) 1600 with low power synchronizer with retention, according to one embodiment of the disclosure. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. It is pointed out that those elements of FIG. 8 having the same reference numbers (or names) as the elements of any other figure can operate or function in any manner similar to that described, but are not limited to such. In one embodiment, computing device 1600 represents a mobile computing device, such as a computing tablet, a mobile phone or smartphone, a wireless-enabled e-reader, or other wireless mobile device. It will be understood that certain components are shown generally, and not all components of such a device are shown in computing device 1600.

In one embodiment, computing device 1600 includes a first processor 1610 with low power synchronizer with retention, according to the embodiments discussed. Other blocks of the computing device 1600 may also include low power synchronizer with retention according to the embodiments discussed. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs, etc.,) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first memory unit having an input and an output, wherein the first memory unit operates on a first power supply which is operable to be turned off; a second memory unit having an input coupled to the output of the first memory unit, and an output, wherein the second memory unit operates on a second power supply which is always on; and a control logic unit coupled to the first and second memory units, the control logic to provide one or more control signals to each of the first and second memory units.

In one embodiment, the control unit includes logic to reset the first and second sequential units such that the first and second sequential units are independent of logic to reset the first and second sequential units. In one embodiment, the apparatus further comprises: a third memory unit having an input coupled to the output of the second memory unit, and an output, wherein the third memory unit operates on the first power supply; and a fourth memory unit having an input coupled to the output of the third memory unit, and an output, wherein the second memory unit operates on the second power supply. In one embodiment, the control logic unit provides one or more control signals to each of the third and fourth memory units.

In one embodiment, the apparatus further comprises: a third memory unit having an input coupled to the output of the second memory unit, and an output, wherein the third memory unit operates on the first power supply; and a fourth memory unit having an input coupled to the output of the third memory unit, and an output, wherein the second memory unit operates on the first power supply. In one embodiment, the control logic unit provides one or more control signals to each of the third and fourth memory units. In one embodiment, the first, second, third, and fourth memory units are one of latches, flip-flops, and SRAM memory cells.

In one embodiment, the apparatus further comprises a logic gate having a first input to receive data, a second input to receive a reset or preset signal, and an output coupled to the input of the first memory unit. In one embodiment, the first memory unit is a latch which is operable to be reset, and wherein the second memory unit is a latch which is operable to be transparent when the first memory unit is reset.

In another example, an apparatus comprises: a first logic unit to operate on a first clock domain, the first logic unit having an output; a second logic unit to operate on a second clock domain separate from the first clock domain, the second logic unit having an input; and a synchronizer, coupled to the first and second logic units, including: a first sequential unit having an input coupled to the output of the first logic unit, and an output; a second sequential unit having an input coupled to the output of the first sequential unit, and an output; and a control logic unit coupled to the first and second sequential units, the control logic unit operable to cause the first sequential unit to operate as a latch and to cause the second sequential unit to operate as a transparent latch.

In one embodiment, one of the first and second sequential units operates on a power supply which is operable to be turned off and one of the first and second sequential units operates on an always on power supply. In one embodiment, the first sequential unit operates on a first power supply which is operable to be turned off, and wherein the second sequential unit operates on a second power supply which is always on. In one embodiment, the control unit includes logic to reset the first and second sequential units such that the first and second sequential units are independent of logic to reset the first and second sequential units.

In one embodiment, the control logic operates on the first power supply. In one embodiment, the apparatus further comprises: a third sequential unit having an input coupled to the output of the second sequential unit, and an output, wherein the third sequential unit operates on the first power supply; and a fourth sequential unit having an input coupled to the output of the third sequential unit, and an output, wherein the second sequential unit operates on the second power supply.

In one embodiment, the control logic is operable to cause the third and fourth sequential units to operate as a transparent latch. In one embodiment, state information is stored in the second and fourth sequential units when first power supply is turned off. In one embodiment, the apparatus further comprises: a third sequential unit having an input coupled to the output of the second sequential unit, and an output, wherein the third sequential unit operates on the first power supply; and a fourth sequential unit having an input coupled to the output of the third sequential unit, and an output, wherein the second sequential unit operates on the first power supply.

In another example, a system is provided which comprises: a memory unit; a processor coupled to the memory unit, the processor including a synchronizer which comprises: a first memory unit having an input and an output, wherein the first memory unit operates on a first power supply which is operable to be turned off; a second memory unit having an input coupled to the output of the first memory unit, and an output, wherein the second memory unit operates on a second power supply which is always on; and a control logic unit coupled to the first and second memory units, the control logic to provide one or more control signals to each of the first and second memory units; a wireless interface for allowing the processor to communicate with another device; and a display unit for displaying content processed by the processor. In one embodiment, the control logic unit is operable to cause the first memory unit to operate as a latch and to cause the second memory unit to operate as a transparent latch.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first memory unit having an input and an output, wherein the first memory unit operates on a first power supply which is operable to be turned off;
   a second memory unit having an input coupled to the output of the first memory unit, and an output, wherein the second memory unit operates on a second power supply which is always on;
   a third memory unit having an input coupled to the output of the second memory unit, and an output, wherein the third memory unit operates on the first power supply;
   a fourth memory unit having an input coupled to the output of the third memory unit, and an output, wherein the second memory unit operates on the second power supply; and
   a control logic unit coupled to the first, second, third and fourth memory units, the control logic to provide one or more control signals to each of the first, second, third and fourth memory units, wherein the control logic unit is operable to cause the first memory unit to operate as a latch and to cause each of the second and fourth memory units to operate as a transparent latch.

2. The apparatus of claim 1, wherein the control unit includes logic to reset the first and second memory units such that the first and second memory units are independent of logic to reset the first and second memory units.

3. The apparatus of claim 1, wherein the first, second, third, and fourth memory units are one of latches, flip-flops, and SRAM memory cells.

4. The apparatus of claim 1 further comprises a logic gate having a first input to receive data, a second input to receive a reset or preset signal, and an output coupled to the input of the first memory unit.

5. The apparatus of claim 1, wherein the first memory unit is a latch which is operable to be reset, and wherein the second memory unit is a latch which is operable to be transparent when the first memory unit is reset.

6. An apparatus comprises:
   a first logic unit to operate on a first clock domain, the first logic unit having an output;
   a second logic unit to operate on a second clock domain separate from the first clock domain, the second logic unit having an input; and
   a synchronizer, coupled to the first and second logic units, including:
      a first sequential unit having an input coupled to the output of the first logic unit, and an output;
      a second sequential unit having an input coupled to the output of the first sequential unit, and an output;
      a third sequential unit having an input coupled to the output of the second sequential unit;
      a fourth sequential unit having an input coupled to the output of the third sequential unit; and
      a control logic unit coupled to the first, second, third and fourth sequential units, the control logic unit operable to cause the first sequential unit to operate as a latch and to cause each of the second and fourth sequential units to operate as a transparent latch,
      wherein the first and third sequential units operates on a first power supply which is operable to be turned off, and wherein the second sequential unit operates on a second power supply which is always on.

7. The apparatus of claim 6, wherein one of the first and second sequential units operates on a power supply which is operable to be turned off and one of the first and second sequential units operates on an always on power supply.

8. The apparatus of claim 6, wherein the first sequential unit operates on a first power supply which is operable to be turned off, and wherein the second sequential unit operates on a second power supply which is always on.

9. The apparatus of claim 8, wherein the control unit includes logic to reset the first and second sequential units such that the first and second sequential units are independent of logic to reset the first and second sequential units.

10. The apparatus of claim 7, wherein the control logic operates on the first power supply.

11. An apparatus comprises:
 a first logic unit to operate on a first clock domain, the first logic unit having an output;
 a second logic unit to operate on a second clock domain separate from the first clock domain, the second logic unit having an input; and
 a synchronizer, coupled to the first and second logic units, including:
  a first sequential unit having an input coupled to the output of the first logic unit, and an output;
  a second sequential unit having an input coupled to the output of the first sequential unit, and an output;
  a third sequential unit having an input coupled to the output of the second sequential unit;
  a fourth sequential unit having an input coupled to the output of the third sequential unit; and
  a control logic unit coupled to the first, second, third and fourth sequential units, the control logic unit operable to cause the first sequential unit to operate as a latch and to cause the second sequential unit to operate as a transparent latch, and
 wherein the first and third sequential units operate on a first power supply which is operable to be turned off, and wherein the second sequential unit operates on a second power supply which is always on, and further wherein state information is stored in the second and fourth sequential units when first power supply is turned off.

12. A system comprising:
 a memory unit;
 a processor coupled to the memory unit, the processor including a synchronizer which comprises:
  a first memory unit having an input and an output, wherein the first memory unit operates on a first power supply which is operable to be turned off;
  a second memory unit having an input coupled to the output of the first memory unit, and an output, wherein the second memory unit operates on a second power supply which is always on;
  a third memory unit having an input coupled to the output of the second memory unit, and an output, wherein the third memory unit operates on the first power supply;
  a fourth memory unit having an input coupled to the output of the third memory unit, and an output, wherein the second memory unit operates on the second power supply; and
  a control logic unit coupled to the first, second, third and fourth memory units, the control logic to provide one or more control signals to each of the first, second, third and fourth memory units, wherein the control logic unit is operable to cause the first memory unit to operate as a latch and to cause each of the second and fourth memory units to operate as a transparent latch;
 a wireless interface for allowing the processor to communicate with another device; and
 a display unit for displaying content processed by the processor.

13. The system of claim 12, wherein the control logic unit is operable to cause the first memory unit to operate as a latch and to cause the second memory unit to operate as a transparent latch.

* * * * *